United States Patent
Piirainen

Patent Number: 6,009,127
Date of Patent: Dec. 28, 1999

[54] METHOD FOR FORMING TRANSITION METRICS AND A RECEIVER OF A CELLULAR RADIO SYSTEM

[75] Inventor: Olli Piirainen, Oulu, Finland

[73] Assignee: Nokia Telecommunications Oy, Espoo, Finland

[21] Appl. No.: 08/875,200

[22] PCT Filed: Dec. 3, 1996

[86] PCT No.: PCT/FI96/00646

§ 371 Date: Aug. 1, 1997

§ 102(e) Date: Aug. 1, 1997

[87] PCT Pub. No.: WO97/21275

PCT Pub. Date: Jun. 12, 1997

[30] Foreign Application Priority Data

Dec. 4, 1995 [FI] Finland .................................. 955827

[51] Int. Cl.⁶ .............................. H03D 1/00; H04L 27/06
[52] U.S. Cl. ...................... 375/341; 375/340; 371/43.4; 371/43.7; 371/43.8
[58] Field of Search ..................................... 375/340, 341, 375/262, 265; 371/43.1, 43.4, 43.6, 43.7, 43.8, 40.4, 49.3

[56] References Cited

U.S. PATENT DOCUMENTS

| | | | |
|---|---|---|---|
| 4,536,878 | 8/1985 | Rattlingourd et al. | 371/43 |
| 5,077,743 | 12/1991 | Bitzer et al. | 371/43 |
| 5,204,878 | 4/1993 | Larsson | 375/341 |
| 5,349,589 | 9/1994 | Chennakesku et al. | 371/43 |
| 5,544,178 | 8/1996 | Zook | 371/43 |
| 5,579,344 | 11/1996 | Namekata | 375/341 |

FOREIGN PATENT DOCUMENTS

| | | |
|---|---|---|
| 0 671 836 A2 | 2/1995 | European Pat. Off. . |
| 0 674 397 A2 | 3/1995 | European Pat. Off. . |

OTHER PUBLICATIONS

Digital Communications, Modulation and Demodulation for the Additive Gaussian Noise Channel, pp. 233–287.

Gerhard Fettweis and Heinrich Meyr, IEEE Communications Magazine, May 1991, High–Speed Parallel Viterbi Decoding: Algorithm and VLSI–Architecture.

Joachim Hagenauer and Peter Hoeher, Dallas Globecom '89 Telecommunications Conference & Exhibition, Nov. 27–30, 1989, A Viterbi Algorithm With Soft–Decision Outputs and its Applications, pp.1680–1686.

Digital Communications, Efficient Signaling with Coded Waveforms, Optimum Decoding of Convolutional Codes––The Viterbi Algorithm, pp. 454–469.

*Primary Examiner*—Chi H. Pham
*Assistant Examiner*—Emmanuei Bayard
*Attorney, Agent, or Firm*—Pillsbury Madison & Sutro LLP

[57] ABSTRACT

A method and a receiver for forming transition metrics in the receiver of a digital cellular radio system. The receiver includes a hardware implementation of a transition metrics calculation unit for Viterbi decoding. The receiver includes a shift register for storing coefficients of a generator polynomial of a convolutional code. The receiver also includes masking means arranged to mask a state of the Viterbi decoding by the coefficients of the polynomial. The receiver has odd parity means arranged to form a parity bit of the state of the masked Viterbi decoding, the parity bit being arranged to control a block forming the transition metrics.

11 Claims, 2 Drawing Sheets

METHOD FOR FORMING TRANSITION METRICS AND A RECEIVER OF A CELLULAR RADIO SYSTEM

BACKGROUND OF THE INVENTION

1. Field of the Invention

The present invention relates to a method for forming transition metrics in a receiver of a digital cellular radio system, the receiver being based on a hardware implementation of a Viterbi decoding and the system utilizing predetermined metrics and a signal coded by one or more convolutional codes.

The invention further relates to a receiver of a digital cellular radio system, comprising the hardware implementation of a transition metrics calculation unit for Viterbi decoding, the system utilizing predetermined metrics and a signal coded by one or more convolutional codes.

2. Description of Related Art

A convolutional code is recursive, and it is formed in a known manner by a finite-state coder whose state depends only on the previous symbols of the code. The code words of the convolutional code, which are symbols representing bits or combinations of bits, may be depicted by means of a trellis diagram. The trellis represents the co-dependence between the states of the Viterbi decoding and received symbols. By utilizing trellis, a symbols received are estimated. A convolutional coder may be seen as a shift register having the length m, resulting in that it may be depicted by a polynomial of the degree m at most. This means that the polynomial coefficients represent the taps of the filter, and the polynomials are referred to as generator polynomials of the convolutional code. By means of redundancy created by convolutional coding, the errors caused by the channel on the message transmitted are reduced. The prior art teaches using several generating polynomials for the same signal in the convolutional coding, whereby one bit to be transmitted will become a symbol comprising a combination of bits.

In a finite-state discretely-timed Markov process, with white noise influencing the estimates concerning the conditions of the cellular radio system, the optimum recursive algorithm is the Viterbi algorithm. The received signal may be Viterbi decoded at a base station of the cellular radio system or at a subscriber end terminal. In the Viterbi block of the receiver, the trellis of the convolutional-coded message is found, whereby the transition metrics based on the convolutional polynomial of the message transmitted are computed. Thus, in Viterbi decoding, the symbols corresponding to the information transmitted are detected, the symbols representing the bits or bit combinations of the message transmitted. As known, the Viterbi algorithm is used in signal detecting and decoding. From the signal, the Viterbi algorithm generates an estimate for an ML sequence (ML=Maximum Likelihood), and soft decisions for the channel decoding functions. The ML estimate comprises estimates of the symbol sequences within the signal. The ML method is discussed in: Proakis J. G., Digital Communications, McGraw-Hill Book Company, 1989, chapter 4.2, and the hardware implementation of the Viterbi algorithm is discussed in the publication: Fettweis, G. and H. Meyer, High-Speed Parallel Viterbi Decoding: Algorithm and VLSI-Architecture, IEEE Communications Magazine, Vol. 29(5), 1991, which are incorporated herein as reference.

Due to the Viterbi algorithm often being too demanding a task for a digital signal processing program to perform within the processing time allowed by the receiver, separate Viterbi hardware has to be used. The hardware block in the prior art solutions is convolutional-polynomial-specific, which means that the hardware solution has to be redesigned and reimplemented in case the generator polynomials of the convolutional code are changed. This is described in greater detail in J. Hagenauer, P. Hoeher: A Viterbi Algorithm with Soft-decision Outputs and its Applications, IEEE GLOBECOM 1989, Dallas, Tex., November 1989, and in: Digital Communications, by Proakis J. G., McGraw-Hill Book Company, 1989, chapters 5.3.2, 5.3.3 and 5.3.4, which are herein incorporated as reference.

It is therefore an object of the present invention to implement a receiver whose hardware solution does not have to be modified due to changing the convolutional coding or due to adding new convolutional polynomials. The Viterbi block may be made programmable if the transition metrics calculation unit takes into account the possibility to use different convolutional polynomials.

SUMMARY OF THE INVENTION

This object is achieved by a method of the type disclosed in the introduction, characterized by storing the coefficients of the polynomials generating the convolutional code into one or more memory means whose contents may repeatedly be changed; masking the state of Viterbi decoding by the coefficients of the generator polynomials of the convolutional code, said coefficients being stored in the memory means, and; forming a bit representing the parity of the state of the Viterbi decoding masked by the coefficients of the generator polynomials of the convolutional code, said bit being used to control forming the transition metrics.

The receiver according to the invention in a digital cellular radio system is characterized by comprising one or more memory means into which the coefficients of the polynomial generating the convolutional code are arranged to be stored and whose contents are arranged to be continuously changed; by comprising masking means, the coefficients of the polynomial generating the convolutional code stored therein being arranged to be used for masking the state of the Viterbi decoding, and; by comprising parity means arranged to form a bit representing the parity of the state of the masked Viterbi coding, the bit being arranged to control the comparison means used to form the transition metrics.

The solution according to the invention provides a multitude of advantages. It combines the advantages of software and hardware implementation methods by making the hardware transition metrics calculation unit of the Viterbi decoder programmable. This makes it possible, by means of the solution, to change the convolutional polynomials of the Viterbi decoding in an ASIC solution without redesigning the ASIC solution. This saves time and money for example when using a new channel coding function at a GSM base station.

The preferred embodiments of the method of the invention and the cellular radio system of the invention are also set forth in the attached dependent claims.

BRIEF DESCRIPTION OF THE DRAWINGS

In the following, the invention will be described in greater detail with reference to the examples in the accompanying drawings, in which.

DETAILED DESCRIPTION OF THE PREFERRED EMBODIMENT

The hardware solution according to the invention may be used in radio systems where received signals are Viterbi decoded. A typical system could be represented by e.g. a cellular radio system, particularly the GSM system, and the receiver in such a case may be a base station or a subscriber end terminal.

Figure 1:
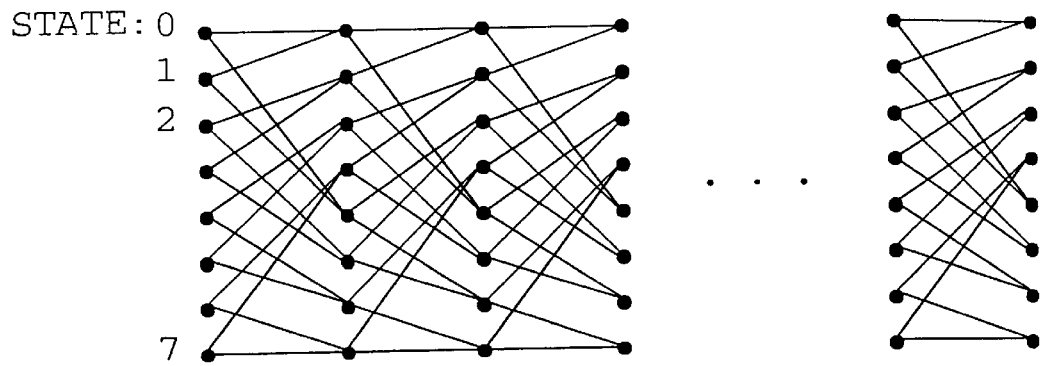
FIG. 1 illustrates a trellis diagram.

The operation of the Viterbi algorithm may be illuminated with the aid of an eight-state trellis diagram of FIG. 1. In case the channel estimated impulse response has N symbols, the Viterbi decoding undergoes a transition to a known state by going through N−1 known symbols. Consequently, these N symbols are present in the state of the trellis diagram and the state transition. Thus, the trellis diagram comprises $2^{N-1}$ states. The impulse response normally has 5 symbols, whereby there are 16 states (in FIG. 1 there are only 8 states for reasons of clarity). The solving of the Viterbi algorithm proceeds from left to right in the trellis diagram, which represents the chronological order of the events in the trellis diagram. From each point, i.e. state, it is possible to arrive at two points, which takes place by two different routes, depending on the bit received. The state in the metrics represents a window displaying only a few bits at a time, usually four bits in an endless bit sequence. From the sequence of bits appearing on the window, a bit will always be omitted as the metrics proceed from one state to another, and simultaneously a new, received, bit enters the sequence at its opposite end. In order to determine the bit received, at each point the better of the paths arriving at said point is chosen, and this information is stored in the memory. Besides a mere hard bit decision (0 or 1), information on the merit of the decision (a so-called soft decision) can also be stored, thus increasing the memory capacity required for each point in the trellis diagram. In the solution of the invention predetermined metrics are used, determined by the polynomials generating the convolutional code in the system. The number of the polynomials determines how many bits transmitted corresponds to one bit coded, and the degree can be seen from the highest degree of the polynomials.

Figure 2:
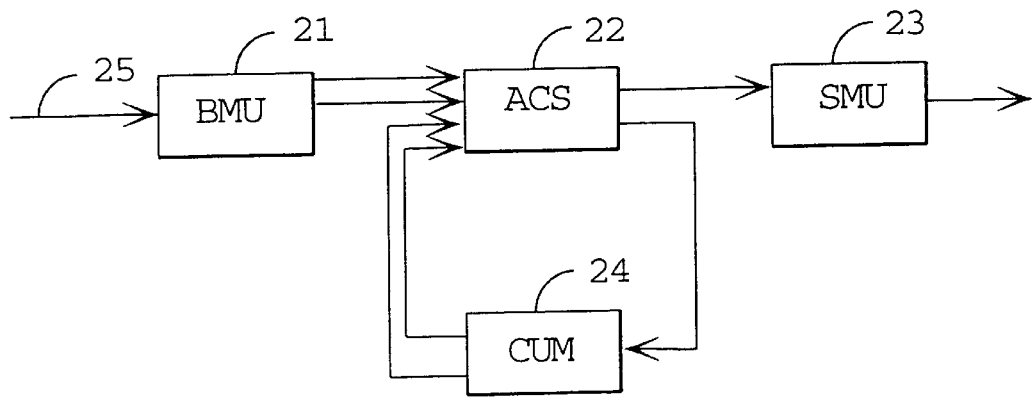
FIG. 2 illustrates the significant parts of a Viterbi block.

The Viterbi algorithm may also be presented in a block diagram form, as illustrated by FIG. 2. The Viterbi decoder comprises a Transition Branch Metrics Unit (BMU) 21, an Add-Compare-Select Unit (ACS) 22, a Survivor Memory Unit (SMU) 23 and a Cumulative Metrics Memory (CUM) 24. The data received 25 are applied to the BMU 21. At each point i.e. state, the BMU 21 forms, on the basis of the convolutional coding of the transmission, a value corresponding to each path entering said point from both possible points. At the ACS 22, the quantities obtained are compared with one another, the value providing the better result is chosen, and the value is added to the sum obtained from the CUM 24, and the value stored in the CUM 24 for calculating the next column. The value obtained is also stored in the memory unit 23 for tracing the correct path. The CUM 24 stores the values previously calculated for each point of the column. By setting the cumulative metrics 24 to zero, all values stored therein will de deleted, resulting in that the next Viterbi decoding will be independent of the previous one. Tracing the correct path is carried out in the memory unit 23, as in prior art, by proceeding from left to right in the trellis diagram. The decoded symbols 26 are obtained from the output of the memory unit 23.

Figure 3:
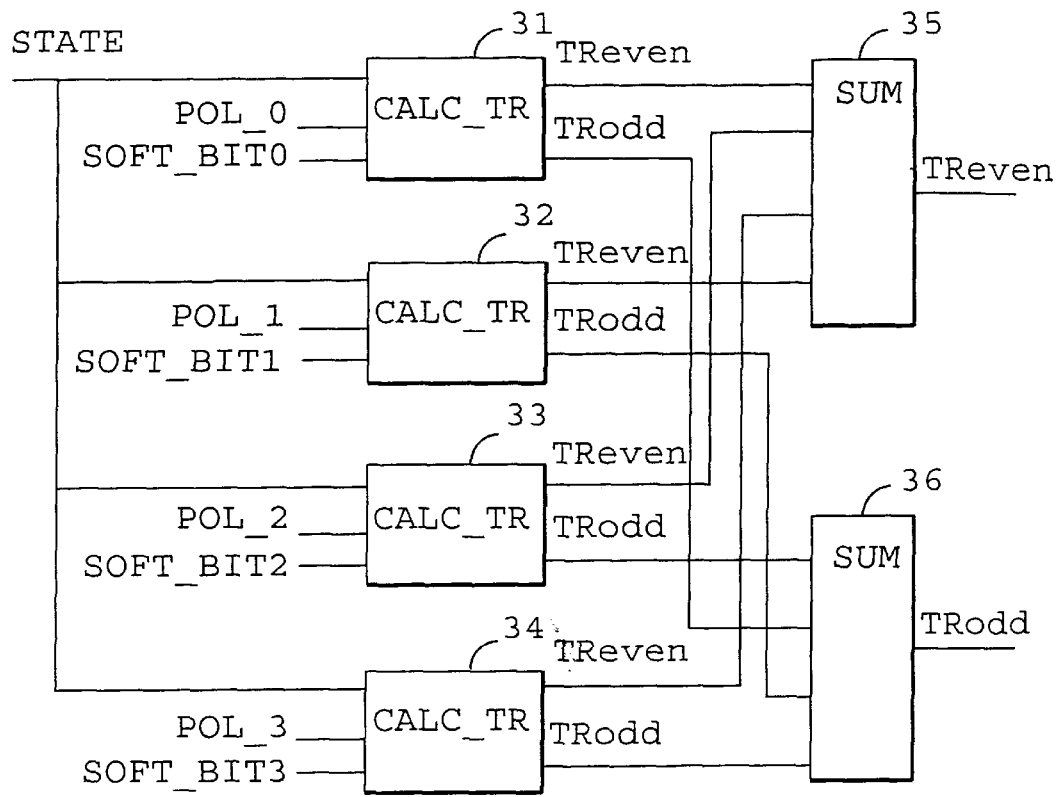
FIG. 3 illustrates the structure of the programmable transition metrics calculation unit according to the invention.

In the following, the transition metrics calculation unit 21, the specific object of the invention, will be described in greater detail, with FIG. 3 illustrating a block diagram example of such a unit. The transition metrics calculation unit 21 according to the preferred embodiment of the invention comprises separate calculation means for each polynomial used in generating the convolutional code. At least as many transition metrics calculation units (CALC_TR) 31, 32, 33 and 34 will be required as there are convolutional codes used in the system. Input to each transition unit 31, 32, 33 and 34 is provided by the Viterbi decoding state STATE and a coefficient from each respective polynomial POL_0, POL_1, POL_2 and POL_3 generating the convolutional code, and a received symbol associated with the polynomial coming into the Viterbi decoding, the symbol advantageously being a soft decision bit SOFT_BIT0, SOFT_BIT1, SOFT_BIT2, SOFT_BIT3. The polynomials POL_0, POL_1, POL_2, and POL_3 are, in the solution according to the invention, programmable into the transition metrics calculation unit 31, 32, 33 and 34. If the symbol entering the Viterbi decoding is a soft decision bit, the advantage gained is that, in addition to the bit associated with the information transfer proper, the symbol also contains information on the merit of the bit value. This bit may also be a hard decision bit, if no attention is paid to the merit of the bit decision. The outputs of each transition metrics calculation unit 31, 32, 33 and 34 are provided by bits that represent, in the Viterbi decoding trellis diagram (FIG. 1), paths in accordance with which one of the possible paths comes into each state. Thus, the outputs indicate whether there is an even or odd number of the bit "1". The output parity therefore indicates the bit that is omitted from the symbol sequence of the trellis state when a new, received, bit enters the opposite end of the symbol sequence. The even combinations of the outputs from the transition metrics calculation unit 31, 32, 33 and 34 are applied to a summer 35 and the odd combinations of the outputs are applied to a summer 36. Both of these summers 35 and 36 operate in the preferred embodiment of the invention, in two's complement logic when soft bit decisions are employed. The aforementioned summers calculate the sum of single transitions of the different transition metrics calculation units 31, 32, 33 and 34, and consequently compensate for errors possibly occurring on the transmission path in some of the codings. The outputs of the summers 35 and 36 are fed to the add-compare-select unit 22, the other blocks of the Viterbi decoding being as in the prior art.

Figure 4:
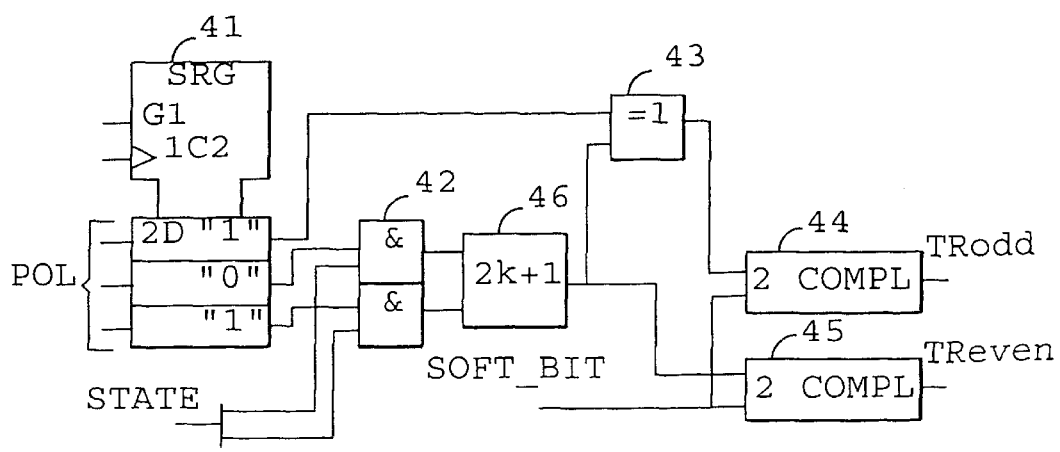
FIG. 4 illustrates the structure of the transition metrics calculation unit according to the invention.

One embodiment of the transition metrics calculation unit 31 is described in greater detail in FIG. 4. The transition metrics calculation unit 31 comprises, according to the preferred embodiment of the invention, memory means 41, masking means 42, parity means 43, transition metrics generating blocks 44 and 45 and parity means 46. A shift register advantageously serves as the memory means 41. AND gates advantageously serve as the masking means 42. The comparison means 44 and 45, controlling the forming of the transition metrics, are complement means that form a two's complement when soft bit decisions are employed. The parity means 43 and 46 are advantageously odd parity means whereby the output will be "1" if an odd number of "1"s have arrived at the odd parity means. An exclusive OR gate advantageously serves as the parity means 43.

In the following, the operation of the transition metrics calculation unit 31 will be described in greater detail by using as an example the polynomial $F(D)=D^2+1$ as the polynomial (POL in FIG. 4) generating the convolutional code. Here, F(D) means the function F having the variable D. The general form of the polynomial is $F(D)=f_{n-1}D^{n-1}+f_{n-2}D^{n-2}+\ldots+f_1D+f_0$, where $f_{n-1},\ldots,f_0$ are coefficients of the variable D. In the exemplary case $f_2$ is 1, $f_1$ is 0 and $f_0$ is 1, i.e. the matrix form (here vector form) f is f [1 0 1]. The contents of the shift register 41 will thus be f i.e. 1 0 1 so that in FIG. 4 the LSB (Least Significant Bit) is the topmost and the MSB (Most Significant Bit) is at the bottom, as indicated by the figure by way of example. With the aid of AND gates 42, the polynomial bits are used to mask off the insignificant part, as far as coding is concerned, from the state of the Viterbi coding which is dependent on the current and received bits, i.e. in this example the middle bit 0. Let us assume that STATE 01 prevails. This means that the LSB (Least Significant Bit) of the STATE is 0 and the MSB (Most Significant Bit) is 1. The output of both the AND gates 42 will consequently be 0. These outputs are applied to the parity means, i.e. in this case to the odd parity means, i.e. in this case further to the exclusive OR gate 46. The output COMPeven of the odd parity means 46 is connected to the comparison means 45 whose output will be 0 i.e. TReven is 0. The coefficient of the polynomial with the highest degree term is connected from the shift register 41 directly to the exclusive OR gate 43 to whose second input will be applied the output of the odd parity means 46. The output COMPodd of the gate 43 is connected to the comparison means 44 whose second input is the received symbol SOFT_BIT. The bits COMPodd and COMPeven represent an estimate of which bit is to be omitted from the trellis state symbol sequence upon transition from one state to another. When COMPodd is 1, it means that the bit estimated to be omitted from the state is 1, and when COMPeven is 0 the bit estimated to be omitted is 0. The 0 used herein may correspond to 0 or 1 in the binary system, and in a similar manner 1 may correspond to 0 or 1 in the binary system, depending on what is agreed upon in the system of the invention. By comparing the received bit SOFT_BIT to the estimate COMPodd and COMPeven it will become clear which one of the estimates is closer to being correct. When the received bit SOFT_BIT is in accordance with the soft decision, the distance between the estimate (COMPodd and COMPeven) and the received bit SOFT_BIT is calculated, and on the basis of the distance, estimates will be made as to which bit was more probably received. In this manner, transition metrics are formed. E.g. a two's complementation component may serve as comparison means 44 and 45. When several polynomials generating the convolutional code are employed, the detection correspondingly uses several transition metrics calculation units 31, 32, 33 and 34, as described in association with FIG. 3.

For the parity means 46, a similar pair is in principle needed to which the outputs of the masked states and the coefficients of the polynomials generating the convolutional code are coupled. In practice, a component often having many inputs is therefore not required because a state corresponding to the highest degree of the polynomial does not exist, and therefore a two-input exclusive OR gate, to which the parity means 46 output and a coefficient corresponding to the highest degree of the polynomial are connected, advantageously serves as the pair of the parity means 46.

Figure 5:
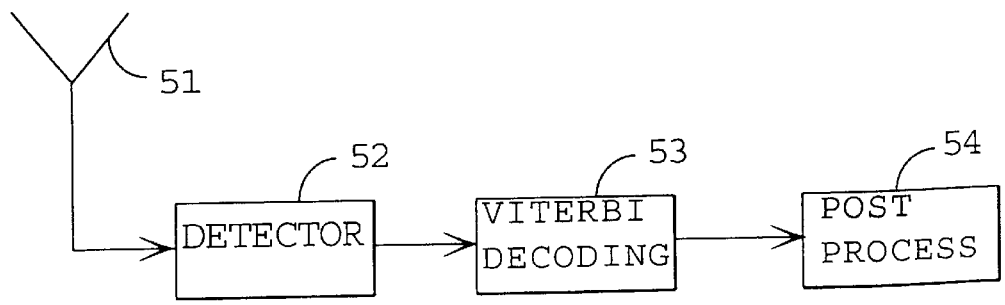
FIG. 5 illustrates the significant parts of a receiver of a cellular radio system.

In the following, a receiver of the invention in a cellular radio system will be described in more detail, with FIG. 5 illustrating in block diagram form the essential parts of such a receiver. The receiver comprises an antenna 51 which receives a signal to be applied to a DETECTOR 52. The signal proceeds to the inventive part of the receiver which is a Viterbi decoding means 53 (VITERBI DECODING). After the Viterbi decoding, the signal proceeds to other signal processing means 54 (POST PROCESS) of the receiver. In the detecting means 52, the radio frequency parts usually transform the signal to an intermediate frequency, after which the detecting means convert the signal from analog to digital. The detecting means 52 may further e.g. filter the signal. The detector 52 often further comprises at least deinterleaving. How the detector 52 works is not essential to the solution of the invention. The Viterbi decoding means 53 operate according to the transition metrics forming principle used in the Viterbi decoding according to the invention, and the outputs of the Viterbi decoding means 53 are the decoded symbols. A more detailed description on the structure and operation of the Viterbi decoding means 53 is offered in association with FIGS. 2, 3 and 4. In other signal processing means 54, for example source decoding and converting the signal into a suitable form from the user's point of view, e.g. speech from a loudspeaker, take place.

In the advantageous embodiment of the invention, information on what generator polynomials of the convolutional code are used or will be incorporated in the system is transmitted to the receiver via the signalling employed by the system. Consequently, there is no need, for example, to send someone with an installing device to every single base station to change the polynomial coefficients whenever a new convolutional code is taken in use in the system. The receiver receives and stores the polynomials transmitted in the memory means 41. The information on the new polynomials may also be fed to the memory means 41 from a loading device operationally connected to the receiver.

Although the invention is described above with reference to the examples in the accompanying drawings, it is obvious that the invention is not restricted thereto but it may be modified in various ways within the inventive idea of the attached claims.

I claim:

1. A method for forming transition metrics in a receiver of a digital cellular radio system, the receiver being based on a hardware implementation of a Viterbi decoding and the receiver utilizing predetermined metrics and a signal coded by at least one convolutional code, the method comprising:

storing a plurality of coefficients of a plurality of polynomials generating the at least one convolutional code into at least one memory having a changeable content:

masking a state of the Viterbi decoding by the coefficients of the generator polynomials of the at least one convolutional code, said coefficients being stored in the memory, and;

forming a bit representing a parity of the state of the Viterbi decoding masked by the coefficients of the generator polynomials of the at least one convolutional code, said bit being used to control forming the transition metrics.

2. A method as claimed in claim 1, wherein the transition metrics, related to more than one of the generator polynomials of the at least one convolutional code, are formed by calculating transitions related to each of the polynomials separately and by combining the transitions thus formed.

3. A method as claimed in claim 2, wherein the combining of the transitions related to the more than one of the generator polynomials of the convolution code comprises summing the transitions of odd and even parities, separately.

4. A method as claimed in claim 1, wherein transition metrics associated with each of the at least one convolution code are formed so that a received symbol is compared to an estimate formed by a parity unit by employing two's complementation.

5. A method as claimed in claim 1, wherein the coefficients of the generator polynomials of the at least one convolutional code are transmitted through signaling used by a cellular radio system in order to be stored in the at least one memory of the receiver.

6. A receiver of a digital cellular radio system, comprising:

a hardware implementation of a transition metrics calculation unit for Viterbi decoding, the system utilizing predetermined metrics and a signal coded by at least one convolutional code, comprising:

at least one memory into which a plurality of coefficients of a polynomial generating the at least one convolutional code are arranged to be stored, the at least one memory having a content being arranged to be continuously changed;

a masking unit, the coefficients of the polynomial generating the at least one convolutional code being stored therein and being arranged to be used for masking a state of the Viterbi decoding, and;

a parity unit arranged to form a bit representing a parity of the state of the masked Viterbi decoding, the bit being arranged to control a comparison unit arranged to form the transition metrics.

7. A receiver as claimed in claim 6, further comprising:

a plurality of separate transition metrics calculation units, each being arranged to form a corresponding transition metric related to a corresponding generator polynomial of the at least one convolutional code by calculating transitions related to each one of the corresponding polynomials separately, and combining means for combining the transitions thus formed.

8. A receiver as claimed in claim 7, wherein the combining means are a plurality of summers arranged to operate so that the transitions of even and odd parities are summed separately.

9. A receiver as claimed in claim 6, wherein the at least one memory that is arranged to store the coefficients of the generator polynomial of the convolutional code is a programmable register.

10. A receiver as claimed in claim 6, wherein the comparison unit is a two's complement circuit.

11. A receiver as claimed in claim 6, wherein the parity unit includes an exclusive OR gate.

* * * * *